(12) United States Patent
Cheng

(10) Patent No.: US 7,529,089 B2
(45) Date of Patent: May 5, 2009

(54) HEAT-DISSIPATING DEVICE CONNECTED IN SERIES TO WATER-COOLING CIRCULATION SYSTEM

(75) Inventor: Chia-Chun Cheng, Chung-Ho (TW)

(73) Assignee: Cooler Master Co., Ltd, Taipei Hsien (TW)

( * ) Notice: Subject to any disclaimer, the term of this patent is extended or adjusted under 35 U.S.C. 154(b) by 64 days.

(21) Appl. No.: 11/847,667

(22) Filed: Aug. 30, 2007

(65) Prior Publication Data

US 2008/0225486 A1 Sep. 18, 2008

(30) Foreign Application Priority Data

Mar. 16, 2007 (TW) .............................. 96204261 U

(51) Int. Cl.
*H05K 7/20* (2006.01)
*H01L 23/473* (2006.01)

(52) U.S. Cl. ........................ 361/699; 361/700; 361/701; 361/702; 361/703; 165/80.4; 165/80.5; 165/104.21; 165/104.33; 165/104.34

(58) Field of Classification Search ................. 361/687, 361/690–697, 699–709, 712; 165/80.3, 80.4, 165/80.5, 104.21–104.27, 104.33, 104.34, 165/185; 62/259.2; 174/15.1, 15.2, 16.3, 174/252; 257/714

See application file for complete search history.

(56) References Cited

U.S. PATENT DOCUMENTS

| | | | |
|---|---|---|---|
| 5,899,265 A * | 5/1999 | Schneider et al. | 165/104.33 |
| 7,096,928 B2 * | 8/2006 | Phillips et al. | 165/104.21 |
| 7,240,722 B2 * | 7/2007 | Lai et al. | 165/104.33 |
| 7,440,278 B2 * | 10/2008 | Cheng | 361/699 |
| 2007/0204646 A1 * | 9/2007 | Gagliano | 62/389 |

FOREIGN PATENT DOCUMENTS

JP 2006012874 A * 1/2006

* cited by examiner

*Primary Examiner*—Michael V Datskovskiy
(74) *Attorney, Agent, or Firm*—Rabin & Berdo, P.C.

(57) ABSTRACT

A heat-dissipating device includes a MOSFET heat dissipator, a south bridge heat dissipator, a north bridge heat dissipator and a water block connector. A heat pipe is provided between each heat dissipator to connect these heat dissipators in series. Further, the north bridge heat dissipator has a heat-dissipating bottom plate and a heat-dissipating body attached to a half portion of the heat-dissipating bottom plate. Further, the water block connector comprises a hollow base and two connecting tubes that are provided on two locations of the base and in communication with each other. The base of the water block connector is attached to the other half portion of the heat-dissipating bottom plate of the north bridge heat dissipater. When the water cooling is used, the two connecting tubes of the water block connector can be connected in series with a water-cooling circulation system.

12 Claims, 3 Drawing Sheets

HEAT-DISSIPATING DEVICE CONNECTED IN SERIES TO WATER-COOLING CIRCULATION SYSTEM

BACKGROUND OF THE INVENTION

1. Field of the Invention

The present invention relates to a heat-dissipating system, and in particular to a heat-dissipating device which can be applied to a main board of a computer and simultaneously dissipates the heat generated by each electronic heat-generating element on the main board.

2. Description of Prior Art

With the highly advanced progress of technical industry, the performance of each electronic heat-generating element (such as, south and north bridge chips, Metal Oxide Semiconductor Field Effect Transistor (MOSFET) chip, or a central processor) on the main board of a computer also improves to a large extent. As a result, the amount of heat generated in operation also increases substantially. Currently, each of the above-mentioned electronic heat-generating elements has a corresponding heat dissipator or heat-dissipating device. Especially, the central processor is provided thereon with a water-cooling circulation heat-dissipating system to replace the traditional air-cooling system, thereby maintaining it to be operated normally under an acceptable temperature.

Conventionally, in order to facilitate the integration, a plurality of water blocks are mounted on each electronic heat-generating element. Further, a pipeline through which the cooling liquid flows is used to connect each water block in series, and also connect to a pump and a heat-dissipating structure such as heat-dissipating fins. With the above arrangement, a water-cooling circulation heat-dissipating system is formed. Via the pump, the cooling liquid can flow in each water block to perform a heat-exchanging action, thereby achieving the heat dissipation of the plurality of electronic heat-generating elements. However, in the current do-it-yourself (DIY) market, a common main board of a computer only provides heat dissipators for south and north chips and the MOSFET chip, but does not provide a heat dissipator or heat-dissipating device for a central processor. This is because the central processor can be selectively changed according to the demand of the consumer. When the performance of the selected central processor is better, the demand for heat-dissipating performance of the corresponding heat dissipator or heat-dissipating device is also higher accordingly. Therefore, the manufacturer of the main board cannot provide a suitable heat-dissipating system in advance for the consumer because he does not know what kind of the central processor the consumer may desire. Therefore, the consumer can only buy an additional heat-dissipating system to meet his/her demands.

In such circumstance, the manufacturer of the main board can only design a set of associated apparatus for the heat dissipation of the north and south bridge chips and the MOSFET chip. Further, the manufacture has to provide a further combination with the water-cooling heat-dissipating system for the selected central processor. After combination, the heat-dissipating system must solve the problems with respect to the heat dissipation of each electronic heat-generating element on the main board of the computer. In this way, the demand of the consumer in the DIY market can be completely satisfied.

SUMMARY OF THE INVENTION

The present invention is to provide a heat-dissipating device which can be connected in series to the water-cooling heat-dissipating system of the central processor bought by the consumer, thereby achieving the desired heat-dissipating performance of the central processor. Further, the problem of dissipating the heat generated by the electronic heat-generating elements such as south and north bridge chips and the MOSFET chip can be solved simultaneously.

The present invention is to provide a heat-dissipating device connected in series to a water-cooling circulation system, which includes a MOSFET heat dissipator, a south bridge heat dissipator, a north bridge heat dissipator and a water block connector. A heat pipe is provided between each heat dissipator to connect these heat dissipators in series. Further, the north bridge heat dissipator has a heat-dissipating bottom plate and a heat-dissipating body attached to a half portion of the heat-dissipating bottom plate. Further, the water block connector comprises a hollow base and two connecting tubes that are provided at two locations of the base and in communication with each other. The base of the water block connector is attached to the other half portion of the heat-dissipating bottom plate of the north bridge heat dissipater. Via this arrangement, the two connecting tubes of the water block connector can be connected in series with a pipeline of a water-cooling circulation system, or alternatively, is not connected in series with the water-cooling circulation system to merely dissipate the heat of the south and north bridge chips and the MOSFET chip.

DETAILED DESCRIPTION OF THE INVENTION

In order to make the Examiner to better understand the characteristics and technical contents of the present invention, a detailed description will be made with reference to the accompanying drawings. However, it should be understood that the drawings are illustrative only but not to limit the scope of the present invention.

Figure 1:
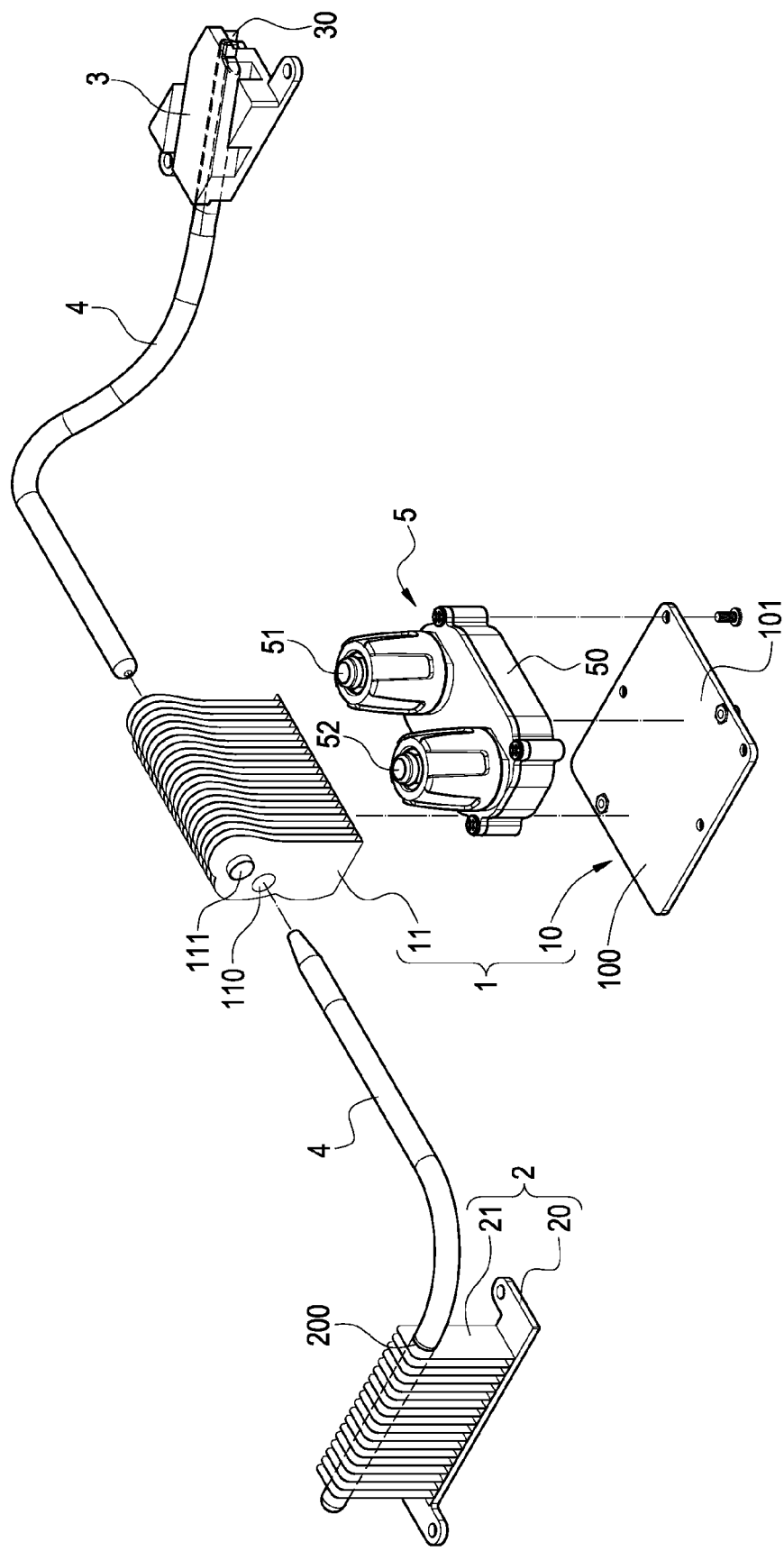
FIG. 1 is an exploded perspective view of the present invention.
Figure 2:
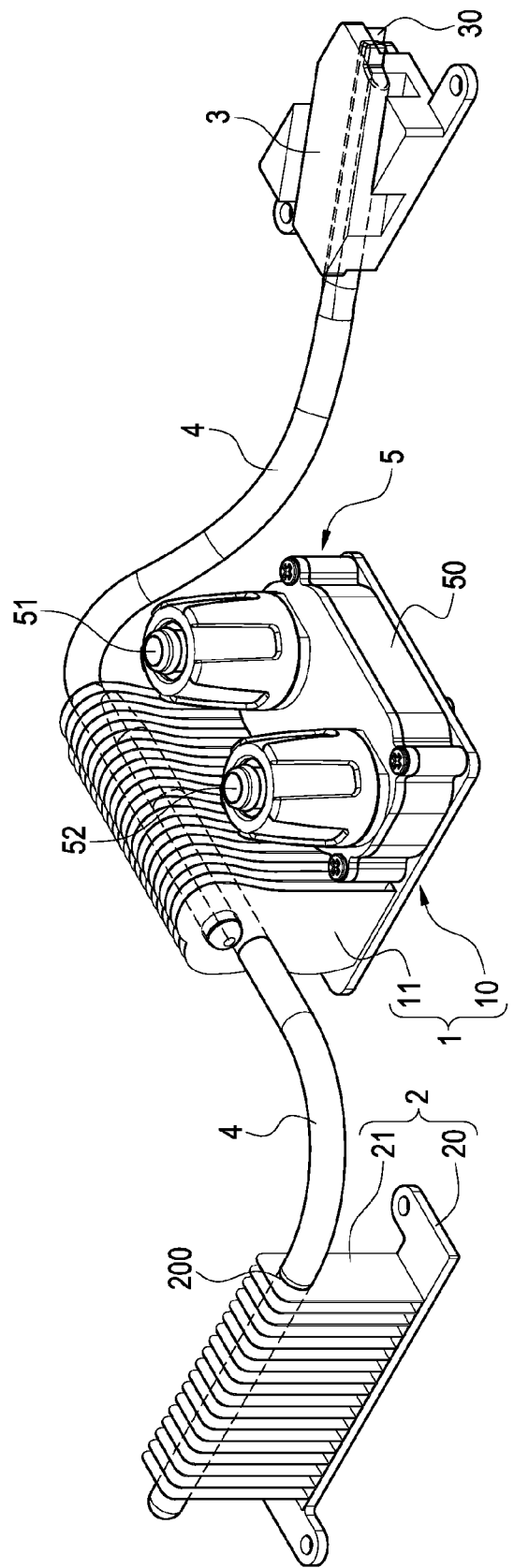
FIG. 2 is an assembled perspective view of the present invention.

FIG. 1 and FIG. 2 are an exploded perspective view and an assembled perspective view of the present invention respectively. The present invention is to provide a heat-dissipating device connected in series to a water-cooling circulation system, which includes a north bridge heat dissipator 1, a MOSFET heat dissipater 2, a south bridge heat dissipater 3, two heat pipes 4 and a water block connector 5.

Figure 3:
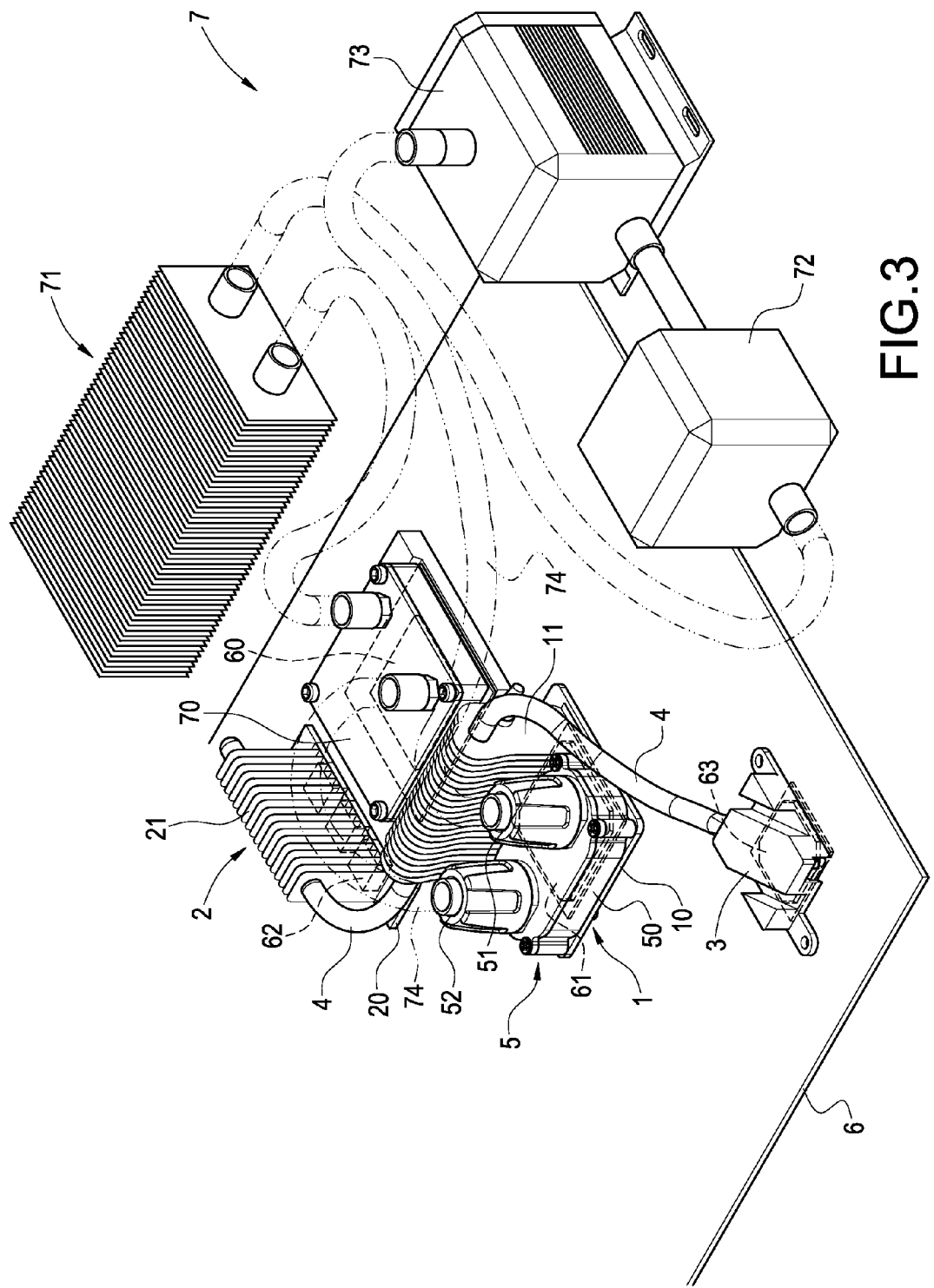
FIG. 3 is a perspective view showing the operating state of the present invention.

The north bridge heat dissipator 1 is used to facilitate the heat dissipation of a north bridge chip 61 (FIG. 3). The north bridge heat dissipator 1 is constituted of a heat-dissipating bottom plate 10 and a heat-dissipating body 11. The heat-dissipating body 11 is made by stacking and arranging transversely a plurality of upright fins, and is attached to an upper surface of a half portion 100 of the heat-dissipating bottom plate 10. A lower surface of the heat-dissipating bottom plate 10 is brought into contact with the north bridge chip 61 to facilitate the heat dissipation thereof.

The MOSFET heat dissipator 2 is used to facilitate the heat dissipation of each MOSFET chip 62 (FIG. 3). The MOSFET heat dissipator 2 is constituted of a heat-dissipating base 20 and a plurality of heat-dissipating fins 21 that are upright and arranged transversely. The bottom surface of the heat-dissipating base 20 is attached to each MOSFET chip 62 to facilitate the heat dissipation thereof.

The south bridge heat dissipator 3 is used to facilitate the heat dissipation of a south bridge chip 63 (FIG. 3). The south bridge heat dissipator 3 is constituted of a plate-like heat-dissipating block. The bottom surface of the heat-dissipating block is attached to a south bridge chip 63 to facilitate the heat dissipation thereof.

Incidentally, the forms of the above-mentioned heat dissipaters 1, 2, 3 can be made of various aluminum extrusions or other suitable material or structure that has a heat-dissipating effect.

The two heat pipes 4 are used to connect the heat dissipators 1, 2, 3 in series. Via the heat pipes 4, among the heat dissipators 1, 2, 3, the heat generated by a heat dissipator whose temperature is higher can be transmitted to a heat dissipator whose temperature is lower, so that the heat of the heat dissipators 1, 2, 3 can be distributed uniformly and thus the heat may not concentrate in one heat dissipator.

According to the above, the north bridge heat dissipator 1 is provided on each fin of the heat-dissipating body 11 with a set of first penetrating holes 110 opposing to one another and another set of second penetrating holes 111 opposing to one another. The MOSFET heat dissipator 2 is provided on each heat-dissipating fin 21 with a set of third penetrating holes 200 opposing to one another. Further, the bottom surface of the south bridge heat dissipator 3 is provided with a channel 30. The heat pipe 4 is provided between the north bridge heat dissipator 1 and the MOSFET heat dissipator 2, and the other heat pipe 4 is provided between the north bridge heat dissipator 1 and the south bridge heat dissipator 3. Both ends of the heat pipe 4 penetrate into the first penetrating holes 110 of the north bridge heat dissipator 1 and the third penetrating holes 200 of the MOSFET heat dissipator 2 respectively, so that it can be connected in series between the north bridge heat dissipator 1 and the MOSFET heat dissipator 2. Both ends of the other heat pipe 4 also penetrate into the second penetrating holes 111 of the north bridge heat dissipator 1 and the channel 30 of the south bridge heat dissipator 3 respectively, so that it can be connected in series between the north bridge heat dissipator 1 and the south bridge heat dissipator 3. In addition, only one heat pipe 4 can be used to connect the south bridge heat dissipator 3, the north bridge heat dissipator 1 and the MOSFET heat dissipator 2 in series.

The water block connector 5 is used to be further connected in series with a water-cooling circulation system 7 (FIG. 3), thereby simultaneously dissipating the heat generated by each electronic heat-generating element (such as central processor 60, south bridge chip 63, north bridge chip 61, or each MOSFET chip 62) on a main board 6 of a computer. Of course, it can perform the heat dissipation of each chip on a displaying card. The water block connector 5 comprises a base 50 having a hollow chamber therein, and two connecting tubes 51, 52 provided at two locations of the base 50. The two connecting tubes 51, 52 are in communication with the interior of the base 50, and are connected with a pipeline 74 (FIG. 3) of the water-cooling circulation system 7 to form a circulation circuit. The base 50 is attached to the upper surface of the other half portion 101 of the heat-dissipating bottom plate 10 of the north bridge heat dissipator 1, and is juxtaposed with the heat-dissipating body 11 of the north bridge heat dissipator 1. Via this arrangement, the heat absorbed by the heat-dissipating bottom plate 10 can be transmitted to the base 50 of the water block connector 5. Alternatively, the heat-dissipating body 11 can concentrate the heat of the MOSFET heat dissipator 2 and the south bridge heat dissipator 3 and transmit the heat to the base 50 of the water block connector 5 via the heat-dissipating bottom plate 10, so that the external water-cooling circulation system 7 can also carry the heat away.

Therefore, with the above arrangement, the heat-dissipating device connected in series to a water-cooling circulation system in accordance with the present invention can be achieved.

As shown in FIG. 3, when the water block connector 5 is not connected in series to the water-cooling circulation system 7, each heat dissipator 1, 2, 3 can still exhibit its function to perform the heat dissipation of the corresponding electronic heat-generating element by means of air cooling. When the water-cooling heat dissipation is used, the two connecting tubes 51, 52 of the water-cooling connector 5 are connected in series with the pipeline 74 of the water-cooling circulation system 7. The water-cooling circulation system 7 facilitates the central processor 60 to dissipate the heat thereof via the water block connector 70. Further, since it has other members such as fin-type heat-dissipating structure 71 connected in series to the pipeline 74, a water tank 72 and a pump 73, the heat generated by each electronic heat-generating element on the main board 6 can be all dissipated after the water block connector 5 is connected in series to form a circulation circuit. In this way, the water-cooling heat dissipation can be achieved.

According to the above, the present invention can solve the drawbacks of prior art and achieve the expected purposes. Further, it indeed involves novelty and inventive steps and thus conforms to the requirements for a utility model patent.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating device connected in series to a water-cooling circulation system, comprising:
    a Metal Oxide Semiconductor Field Effect Transistor (MOSFET) heat dissipator;
    a south bridge heat dissipator;
    a north bridge heat dissipator comprising a heat-dissipating bottom plate and a heat-dissipating body attached to a half portion of the heat-dissipating bottom plate; and
    a water block connector comprising a hollow base and two connecting tubes provided on two locations of the base and in communication with an interior of the base;
    wherein heat pipes are connected in series among the MOSFET heat dissipator, the south bridge heat dissipator and the north bridge heat dissipator, the base of the water block connector is attached to another half portion of the heat-dissipating bottom plate of the north bridge heat dissipator, so that the two connecting tubes of the water block connector are connected to the water-cooling circulation system.

2. The heat-dissipating device connected in series to the water-cooling circulation system according to claim 1, wherein the MOSFET heat dissipator is constituted of a heat-dissipating base and a plurality of heat-dissipating fins that are upright and arranged transversely.

3. The heat-dissipating device connected in series to the water-cooling circulation system according to claim 1, wherein the south bridge heat dissipator is constituted of a plate-like heat-dissipating block.

4. The heat-dissipating device connected in series to the water-cooling circulation system according to claim 3, wherein the heat-dissipating body of the north bridge heat dissipator is made by stacking and arranging transversely a plurality of upright fins.

5. The heat-dissipating device connected in series to the water-cooling circulation system according to claim 1, wherein the heat-dissipating body of the north bridge heat dissipator is made by stacking and arranging transversely a plurality of upright fins.

6. The heat-dissipating device connected in series to the water-cooling circulation system according to claim 1, wherein two heat pipes are connected in series between the MOSFET heat dissipator and the north bridge heat dissipator, and between the south bridge heat dissipator and the north bridge heat dissipater, respectively.

7. A heat-dissipating device connected in series to a water-cooling circulation system, comprising:
  a first heat source heat dissipator;
  a second heat source heat dissipator;
  a third heat source heat dissipator; and
  a water block connector comprising a hollow base and connecting tubes respectively provided on two locations of the base and in communication with an interior of the base;
  wherein heat pipes are connected in series among the first, second and third heat source heat dissipators, any one of the first, second and third heat source heat dissipators comprises a heat-dissipating bottom plate and a heat-dissipating body attached to a half portion of the heat-dissipating bottom plate, the base of the water block connector is attached to another half portion of the heat-dissipating bottom plate base, so that the two connecting tubes of the water block connector are connected to the water-cooling circulation system.

8. The heat-dissipating device connected in series to the water-cooling circulation system according to claim 7, wherein the heat-dissipating body is made by stacking and arranging transversely a plurality of upright fins.

9. The heat-dissipating device connected in series to the water-cooling circulation system according to claim 7, wherein any one of the remaining two of the first, second and third heat source heat dissipators is constituted of a heat-dissipating base and a plurality of heat-dissipating fins that are upright and arranged transversely.

10. The heat-dissipating device connected in series to the water-cooling circulation system according to claim 9, wherein the remaining one of the first, second and third heat source heat dissipators is constituted of a plate-like heat-dissipating block.

11. The heat-dissipating device connected in series to the water-cooling circulation system according to claim 7, wherein any one of the remaining two of the first, second and third heat source heat dissipators is constituted of a plate-like heat-dissipating block.

12. The heat-dissipating device connected in series to the water-cooling circulation system according to claim 7, wherein two heat pipes are connected in series between the first and third heat source heat dissipators, and between the second and third heat source heat dissipators, respectively.

\* \* \* \* \*